(12) United States Patent
Chen et al.

(10) Patent No.: US 9,853,416 B2
(45) Date of Patent: Dec. 26, 2017

(54) MULTIMODE VERTICAL-CAVITY SURFACE-EMITTING LASER

(71) Applicant: Alcatel-Lucent USA Inc., Murray Hill, NJ (US)

(72) Inventors: Haoshuo Chen, Aberdeen, NJ (US); Nicolas K. Fontaine, Aberdeen, NJ (US); Roland Ryf, Keyport, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 0 days.

(21) Appl. No.: 14/992,760

(22) Filed: Jan. 11, 2016

(65) Prior Publication Data

US 2017/0201066 A1 Jul. 13, 2017

(51) Int. Cl.
| | |
|---|---|
| *H01S 3/038* | (2006.01) |
| *H01S 5/042* | (2006.01) |
| *H01S 5/183* | (2006.01) |
| *H01S 5/187* | (2006.01) |
| *H01S 5/34* | (2006.01) |
| *H01S 5/062* | (2006.01) |

(Continued)

(52) U.S. Cl.
CPC .......... *H01S 5/0425* (2013.01); *H01S 5/0624* (2013.01); *H01S 5/06236* (2013.01); *H01S 5/183* (2013.01); *H01S 5/187* (2013.01); *H01S 5/1835* (2013.01); *H01S 5/18355* (2013.01); *H01S 5/34* (2013.01); *H01S 5/005* (2013.01); *H01S 5/0085* (2013.01); *H01S 5/026* (2013.01)

(58) Field of Classification Search
CPC ................................ H01S 5/183; H01S 5/187

USPC ...................................................... 372/38.05
See application file for complete search history.

(56) References Cited

U.S. PATENT DOCUMENTS

| | | | |
|---|---|---|---|
| 5,903,590 A | 5/1999 | Hadley et al. | |
| 6,057,560 A * | 5/2000 | Uchida | ................. B82Y 20/00 |
| | | | 257/94 |

(Continued)

FOREIGN PATENT DOCUMENTS

| | | |
|---|---|---|
| EP | 0618652 A2 | 10/1994 |
| EP | 0765015 A1 | 3/1997 |

(Continued)

OTHER PUBLICATIONS

Tian, Zhaobing et al., "850-nm VCSEL Transmission Over Standard Single-Mode Fiber Using Fiber Mode Filter," IEEE Photonics Technology Letters, vol. 24, No. 5, Mar. 1, 2012, pp. 368-370.

(Continued)

*Primary Examiner* — Tuan Nguyen
(74) *Attorney, Agent, or Firm* — Mendelsohn Dunleavy, P.C.; Yuri Gruzdkov

(57) ABSTRACT

We disclose a vertical-cavity surface-emitting laser (VCSEL) whose optical resonator can support multiple transverse resonator modes. The VCSEL has a plurality of electrodes that can apply individually controllable electrical currents to the active semiconductor region of the optical resonator and be configured to excite, e.g., a single selected transverse resonator mode or a desired linear combination of transverse resonator modes. In some embodiments, the VCSEL's optical resonator may have an effective lateral geometric shape that causes the excitable transverse resonator modes to correspond to the waveguide modes of a cylindrical optical fiber.

25 Claims, 6 Drawing Sheets

(51) Int. Cl.
*H01S 5/00* (2006.01)
*H01S 5/026* (2006.01)

(56) References Cited

U.S. PATENT DOCUMENTS

| | | | |
|---|---|---|---|
| 6,695,493 | B2 | 2/2004 | Ciemiewcz |
| 6,720,830 | B2 | 4/2004 | Andreou et al. |
| 6,829,286 | B1 | 12/2004 | Guilfoyle et al. |
| RE40,173 | E | 3/2008 | Zediker et al. |
| 7,974,327 | B2* | 7/2011 | Ariga ............... H01S 5/0422 372/38.05 |
| 8,320,769 | B2 | 11/2012 | Essiambre et al. |
| 8,755,118 | B2 | 6/2014 | Chang-Hasnain et al. |
| 2004/0076209 | A1* | 4/2004 | Bour ............... B82Y 20/00 372/45.01 |
| 2005/0100070 | A1 | 5/2005 | Nakayama et al. |
| 2005/0201669 | A1 | 9/2005 | Welch et al. |
| 2008/0279229 | A1 | 11/2008 | Suzuki et al. |
| 2010/0029027 | A1* | 2/2010 | Ikuta ............... H01S 5/18391 438/29 |
| 2011/0243170 | A1* | 10/2011 | Brenner ............ H01S 5/1021 372/45.01 |
| 2011/0280269 | A1* | 11/2011 | Chang-Hasnain .... B82Y 20/00 372/50.1 |
| 2014/0064315 | A1* | 3/2014 | Dummer ............ H01S 5/0261 372/50.124 |
| 2014/0348511 | A1 | 11/2014 | Mutalik et al. |
| 2015/0188291 | A1 | 7/2015 | Tan et al. |

FOREIGN PATENT DOCUMENTS

| | | |
|---|---|---|
| JP | 07321405 A | 12/1995 |
| WO | 2004019179 A2 | 3/2004 |
| WO | 2004093270 A2 | 10/2004 |
| WO | 2014056508 A1 | 4/2014 |

OTHER PUBLICATIONS

Stach, Martin, "High-Performance Low-Cost Optical Link at 850 nm with Optimized Standard Singlemode Fiber and High-Speed Singlemode VCSEL," Annual Report 2004, Optoelectronics Department, University of Ulm, pp. 1-4.

Annual Report 1998 Department of Optoelectronics University of Ulm, www.uni-ulm.de, 1998 [retrieved on Dec. 7, 2015] Retrieved from the Internet: <URL: https://www.uni-ulm.de/fileadmin/website_uni_ulm/iui.inst.140/Jahresbericht/1998/ar1998.pdf> (104 pages).

International Search Report and Written Opinion; dated Mar. 2, 2017 for PCT Application No. PCT/US2017/012688.

Uchida, Takeshi, et al. "Transverse mode control in long-monolithic-cavity VCSELs with temperature-profile control." Electronics Letters 421 (2006): 94-96.

\* cited by examiner

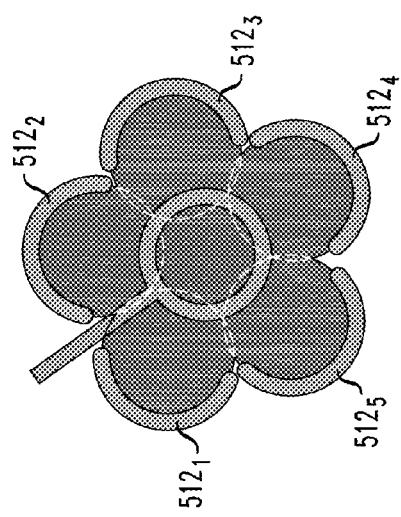
FIG. 2A
200
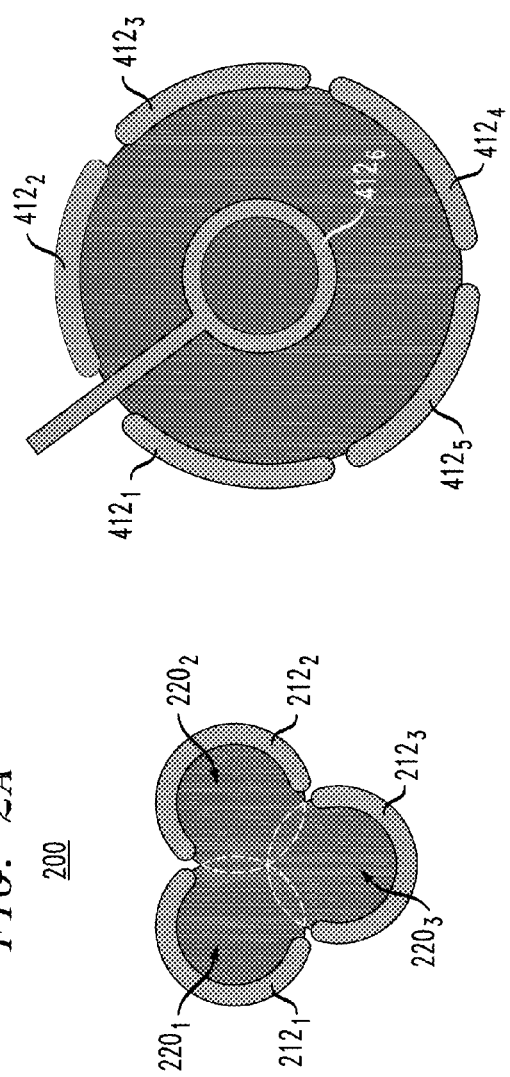
FIG. 4
400
FIG. 5
500

| | VCSEL RESONATOR MODES | FIBER MODES | |
|---|---|---|---|
| CONFIGURATION 1 | $220_1$, $220_2$, $220_3$ | | LP01 |
| CONFIGURATION 2 | $220_1$, $220_2$, $220_3$ | | LP11a |
| CONFIGURATION 3 | $220_1$, $220_2$, $220_3$ | | LP11b |

800

700

600

US 9,853,416 B2

MULTIMODE VERTICAL-CAVITY SURFACE-EMITTING LASER

BACKGROUND

Field

The present disclosure relates to optical communication equipment and, more specifically but not exclusively, to a multimode vertical-cavity surface-emitting laser (VCSEL).

Description of the Related Art

This section introduces aspects that may help facilitate a better understanding of the disclosure. Accordingly, the statements of this section are to be read in this light and are not to be understood as admissions about what is in the prior art or what is not in the prior art.

A vertical-cavity surface-emitting laser (VCSEL) is a semiconductor-based laser that emits a light beam in a direction that is substantially orthogonal to the substrate on which the layered structure of the laser is formed. Due to this geometry, thousands of VCSELs can be manufactured on a single semiconductor wafer. An additional benefit of the VCSEL technology is that each VCSEL can be tested at various stages of the manufacturing process while still in wafer form, which helps to achieve a better-controlled and more-predictable yield and enables lower production costs compared to those of other semiconductor-laser technologies. For at least some of these reasons, the VCSEL technology is being currently actively developed.

SUMMARY OF SOME SPECIFIC EMBODIMENTS

Disclosed herein are various embodiments of a vertical-cavity surface-emitting laser (VCSEL) whose optical resonator can support multiple transverse resonator modes. The VCSEL has a plurality of electrodes that can apply individually controllable electrical currents to the active semiconductor region of the optical resonator and be configured to excite, e.g., a single selected transverse resonator mode or a desired linear combination of transverse resonator modes. In some embodiments, the VCSEL's optical resonator may have an effective lateral geometric shape that causes the excitable transverse resonator modes to correspond to the waveguide modes of a cylindrical optical fiber that may be butt-coupled to the VCSEL.

According to an example embodiment, provided is an apparatus comprising: a substrate; a first distributed Bragg reflector (DBR) mirror supported on the substrate at a first offset distance; a second DBR mirror supported on the substrate at a second offset distance that is greater than the first offset distance; an active semiconductor region located between the first DBR mirror and the second DBR mirror; and a first plurality of electrodes, each configured to inject a respective individually controllable electrical current into the active semiconductor region to cause light generation therein at a lasing wavelength; and wherein an optical resonator bounded by the first DBR mirror and the second DBR mirror is configured to support a plurality of transverse resonator modes corresponding to the lasing wavelength.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Other aspects, features, and benefits of various disclosed embodiments will become more fully apparent, by way of example, from the following detailed description and the accompanying drawings, in which:

FIGS. 2A-2B show top and three-dimensional perspective views of a VCSEL according to another embodiment;

FIG. 3 pictorially illustrates example transverse electric-field profiles that can be generated in the optical resonator of the VCSEL shown in FIGS. 2A-2B according to an embodiment;

FIG. 4 shows a top view of a VCSEL according to an alternative embodiment;

FIG. 5 shows a top view of a VCSEL according to another alternative embodiment;

DETAILED DESCRIPTION

Some embodiments disclosed herein may benefit from the subject matter disclosed in U.S. patent application Ser. No. 14/992,981, which is incorporated herein by reference in its entirety.

Figure 1A:
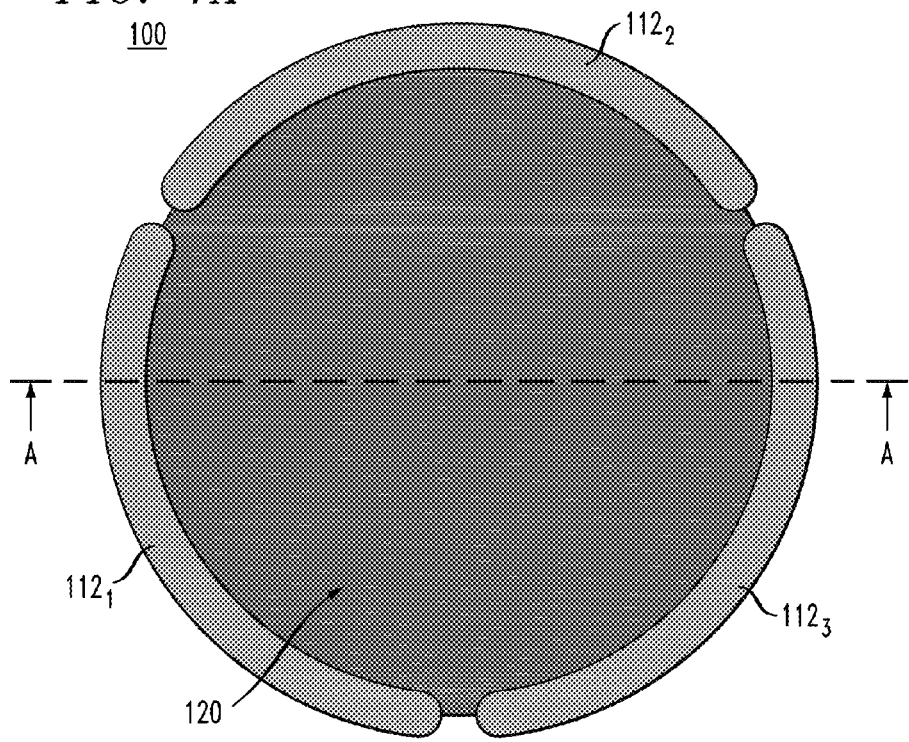
FIGS. 1A-1B show top and cross-sectional side views of a vertical-cavity surface-emitting laser (VCSEL) according to an embodiment.
Figure 1B:
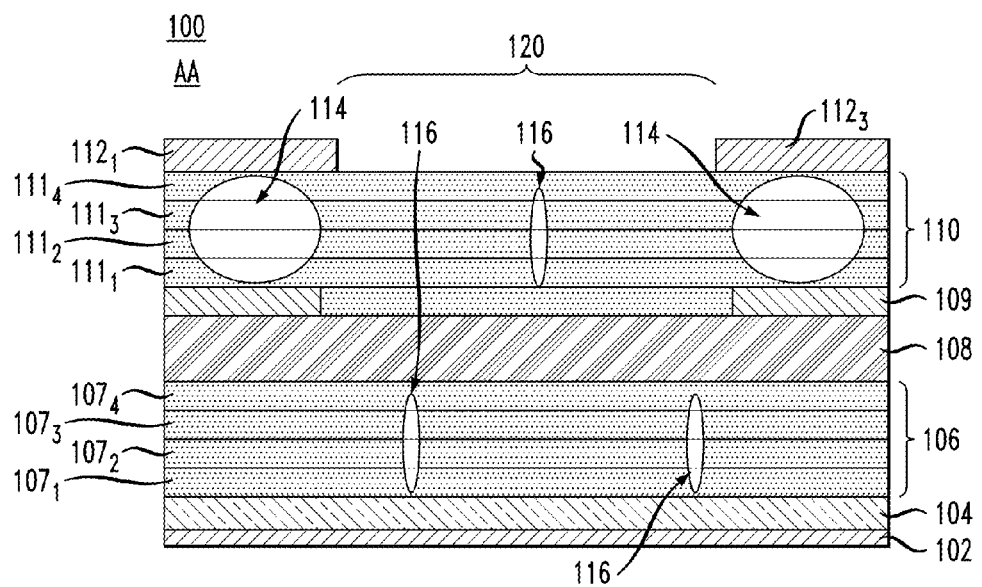

FIGS. 1A-1B show top and cross-sectional side views of a vertical-cavity surface-emitting laser (VCSEL) 100 according to an embodiment. More specifically, FIG. 1A shows a top view of VCSEL 100. FIG. 1B shows a cross-sectional side view of VCSEL 100 along the cross-section plane labeled AA in FIG. 1A.

VCSEL 100 includes a plurality of layers formed on a substrate 104. Some of the layers may include two or more sub-layers (not explicitly shown in FIG. 1A) that differ from each other in chemical composition and/or the concentration and type of the introduced dopant(s). VCSEL 100 further includes metal electrodes 102 and $112_1$-$112_3$. The direction orthogonal to substrate 104 is hereafter referred to as the vertical or axial direction. The directions parallel to substrate 104 are hereafter referred to as the horizontal or lateral directions. In an example embodiment, the vertical size (or thickness) of VCSEL 100 is significantly smaller than its lateral size (or width).

VCSEL 100 has an optical resonator defined by distributed Bragg reflector (DBR) mirrors 106 and 110. This optical resonator also includes an active region 108 sandwiched between DBR mirrors 106 and 110. DBR mirror 106 comprises a plurality of p-doped semiconductor layers 107, only four of which (labeled $107_1$-$107_4$) are shown in FIG. 1B for illustration purposes. Each layer 107 has a thickness that is approximately one quarter of the nominal lasing wavelength. Adjacent layers 107 have alternating (e.g., high/low) refractive indices, which causes DBR mirror 106 to have relatively high reflectivity (e.g., >99%) at the nominal lasing wavelength. In an example embodiment, DBR mirror 106 may have sixty-nine alternating layers of p-doped $Al_{0.9}Ga_{0.1}As$ and p-doped $Al_{0.12}Ga_{0.88}As$.

DBR mirror 110 comprises a plurality of n-doped semiconductor layers 111, only four of which (labeled $111_1$-$111_4$) are shown in FIG. 1B for illustration purposes. Each layer 111 has a quarter-wavelength thickness. Adjacent layers 111 have alternating refractive indices, which causes DBR mirror 110 to also have relatively high reflectivity at the nominal lasing wavelength. In an example embodiment, DBR mirror 110 may have forty-five alternating layers of n-doped $Al_{0.9}Ga_{0.1}As$ and n-doped $Al_{0.12}Ga_{0.88}As$.

Active region 108 includes a quantum-well structure having one or more quantum wells (not explicitly shown in FIG. 1A) designed for generating light at the nominal lasing wavelength. In an example embodiment, the quantum wells of active region 108 are made using doped GaAs. In operation, the relatively high reflectivity of DBR mirrors 106 and 110 causes the generated light to oscillate multiple times between the DBR mirrors before escaping from the optical resonator. These multiple round trips through the optical resonator compensate for the relatively small thickness of active region 108 and enables VCSEL 100 to generate sufficient optical output power for various applications, e.g., in the telecommunications industry. In different embodiments, the pertinent characteristics of DBR mirrors 106 and 110 and active region 108 can be tailored to cause VCSEL 100 to emit light at different desirable wavelengths. For example, different telecommunications applications may use embodiments of VCSEL 100 designed for emitting light in the respective spectral bands located near 850 nm, 1300 nm, or 1550 nm.

DBR mirrors 106 and 110 and active region 108 form an n/p diode junction that can be electrically biased using electrodes 102 and $112_1$-$112_3$. When appropriately biased, active region 108 generates light that is amplified due to the multiple passes through the active region caused by light oscillation in the optical resonator between DBR mirrors 106 and 110. In the shown embodiment, the generated light escapes from the optical resonator of VCSEL 100 through DBR mirror 110. A person of ordinary skill in the art will understand that embodiments in which the generated light escapes from the optical resonator through DBR mirror 106 are also possible.

Some embodiments of VCSEL 100 may benefit from the use of structural features and/or chemical compositions of the various layers disclosed in U.S. Patent Application Publications 2008/0279229 and 2011/0280269 and International Patent Application Publication WO 2014/056508, all of which are incorporated herein by reference in their entirety.

The lateral dimensions of the optical resonator in VCSEL 100 are defined using an aperture 109 and/or ion-implanted regions 114. Ion-implanted regions 114 are formed by implanting suitable ions (e.g., hydrogen ions, $H^+$) into DBR mirror 110 around the mirror periphery, e.g., as indicated in FIG. 1B. The ion-implantation process disrupts, perturbs, and/or destroys the semiconductor lattice in regions 114, thereby inhibiting the flow of the injection current therethrough. Aperture 109 is typically made of an oxide material that is a poor electrical conductor. As such, aperture 109 also inhibits the flow of the injection current through the peripheral portions of VCSEL 100. Since light generation in active region 108 primarily occurs where the injection current physically flows, the optical output of VCSEL 100 is laterally confined to a middle portion 120 thereof. As already indicated above, middle portion 120 is laterally bounded by aperture 109 and/or ion-implanted regions 114.

As indicated in FIG. 1A, middle portion 120 has an approximately circular shape. In alternative embodiments, other transverse geometric shapes of the VCSEL's optical resonator are also possible, e.g., as further illustrated by FIGS. 2A and 5. Typically, the lasing wavelength of VCSEL 100 and the lateral dimensions of middle portion 120 are selected such that the optical resonator of VCSEL 100 can support multiple transverse resonator modes. For example, in a possible embodiment, the optical resonator of VCSEL 100 can be designed to support three or more transverse resonator modes.

A person of ordinary skill in the art will understand that different transverse resonator modes or different combinations of transverse resonator modes can be excited in the optical resonator of VCSEL 100 by applying different individually controlled injection currents to electrodes $112_1$-$112_3$. For example, a fundamental transverse resonator mode can be excited in the optical resonator of VCSEL 100 by applying nominally identical injection currents to all three electrodes $112_1$-$112_3$. A linear combination of transverse resonator modes can be excited in the optical resonator of VCSEL 100 by applying a relatively large injection current to electrode $112_1$ while applying substantially no injection current to electrodes $112_2$-$112_3$. Another linear combination of transverse resonator modes can be excited in the optical resonator of VCSEL 100 by applying a relatively large injection current to electrode $112_2$ while applying substantially no injection current to electrodes $112_1$ and $112_3$, etc.

In some embodiments, optional ion-implanted regions 116 can be formed within DBR mirrors 106 and 110 to enable more-selective excitation of the individual transverse resonator modes using electrodes $112_1$-$112_3$ and/or to cause at least some of the transverse resonator modes of VCSEL 100 to have a more-desirable electric-field profile. In particular, ion-implanted regions 116 can be configured to have a geometric shape and position that cause a better match between the transverse resonator modes of VCSEL 100 and the transverse waveguide modes of an optical fiber configured to receive light from the VCSEL (also see FIGS. 3 and 6). For example, ion-implanted regions 116 can have a geometric shape and position that cause:

(i) a first combination of individual injection currents applied to electrodes $112_1$-$112_3$ to produce, across middle portion 120, an electric-field profile that is similar to the electric-field profile of an LP01 waveguide mode of a cylindrical optical fiber;

(ii) a second combination of individual injection currents applied to electrodes $112_1$-$112_3$ to produce across middle portion 120 an electric-field profile that is similar to the electric-field profile of an LP11a waveguide mode of the cylindrical optical fiber; and (iii) a third combination of individual injection currents applied to electrodes $112_1$-$112_3$ to produce across middle portion 120 an electric-field profile that is similar to the electric-field profile of an LP11b waveguide mode of the cylindrical optical fiber.

A person of ordinary skill in the art will understand that the LP11a and LP11b waveguide modes are degenerate waveguide modes of a cylindrical optical fiber that differ from one another in the relative orientation of the two corresponding light-intensity peaks. More specifically, for the LP11a and LP11b waveguide modes, the two corresponding light-intensity peaks may be aligned along the X- and Y-coordinate axes, respectively (also see FIG. 3).

Figure 2B:
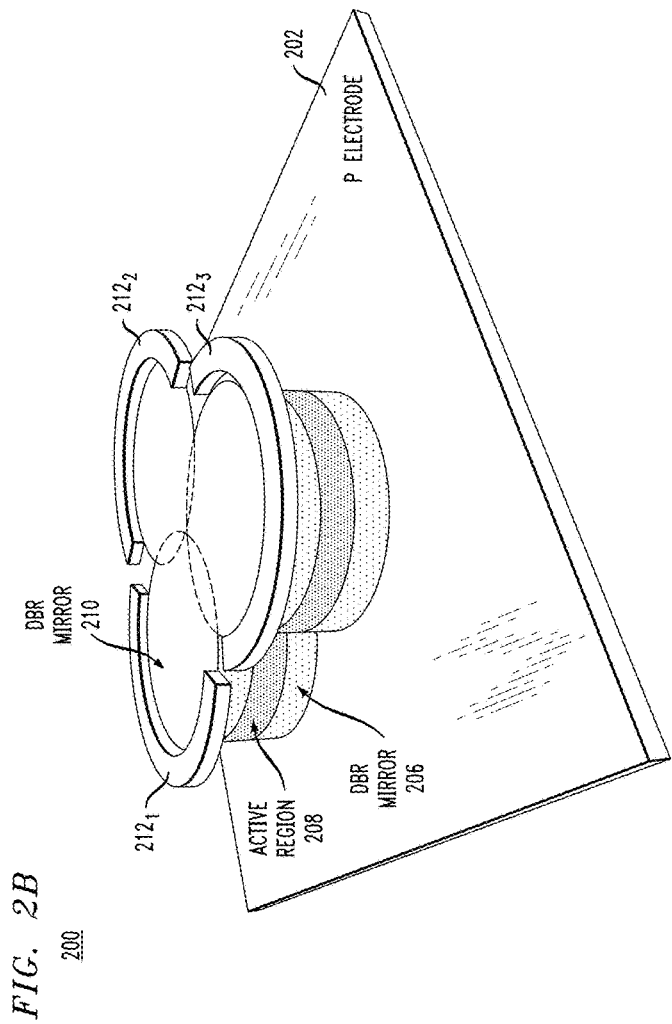

FIGS. 2A-2B show top and three-dimensional perspective views of a VCSEL 200 according to an alternative embodiment. More specifically, FIG. 2A shows a top view of VCSEL 200. FIG. 2B shows a three-dimensional perspective view of VCSEL 200 in which some peripheral structures of the VCSEL are not shown for clarity of depiction.

The semiconductor layer stack used in VCSEL 200 may be generally similar to the semiconductor layer stack used in VCSEL 100 (see FIG. 1B). For example, similar to VCSEL 100, VCSEL 200 has an optical resonator formed by DBR mirrors 206 and 210, with an active region 208 sandwiched between these two DBR mirrors. In an example embodiment, the layer structure of DBR mirrors 206 and 210 and active region 208 may be substantially similar to the layer structure of DBR mirrors 106 and 110 and active region 108, respectively. VCSEL 200 also has metal electrodes 202 and $212_1$-$212_3$ that are functionally analogous to metal electrodes 102 and $112_1$-$112_3$, respectively, of VCSEL 100 (also see FIGS. 1A-1B).

However, VCSEL 200 and VCSEL 100 differ from one another in the geometric shape of their respective optical resonators. For example, the lateral shape of the optical resonator of VCSEL 200 can be approximated using three overlapping circles indicated by the dashed lines in FIG. 2A and labeled $220_1$-$220_3$, respectively. Each of metal electrodes $212_1$-$212_3$ has an approximately semi-circular shape and is located at the outer periphery of the corresponding one of circles $220_1$-$220_3$. When an injection current is applied to active region 208 using a single one of metal electrodes $212_1$-$212_3$, the light emitted by VCSEL 200 exits the optical resonator thereof primarily through the corresponding one of circles $220_1$-$220_3$, with substantially no light being emitted from the other two circles. Different individual injection currents can be applied to metal electrodes $212_1$-$212_3$ to individually control the light-intensity distributions emitted from circles $220_1$-$220_3$. In some embodiments, the relative phase of the electric field of the light emitted from different circles 220 can be controlled, e.g., using appropriate current-injection techniques or by adding one or more extra layers (not explicitly shown in FIG. 2B) to the layer stack of VCSEL 200. In an example embodiment, such extra layers may be specifically designed and configured to controllably vary the phase of the emitted light (also see FIGS. 9-10).

FIG. 3 pictorially illustrates example transverse electric-field profiles that can be generated in the optical resonator of VCSEL 200 according to an embodiment. Three example configurations are shown for illustration purposes. A person of ordinary skill in the art will understand that other configurations are also possible.

In a first configuration illustrated in FIG. 3, nominally identical injection currents are applied to each of electrodes $212_1$-$212_3$ (also see FIGS. 2A-2B). In this configuration, the electric-field profile of the light beam emitted by VCSEL 200 has three peaks of approximately equal amplitude, each approximately centered in the respective one of circles $220_1$-$220_3$. The electric fields in these three peaks have substantially the same phase. A person of ordinary skill in the art will understand that this particular light distribution may be suitable for exciting, with relatively high efficiency, the fundamental mode (e.g., LP10) of a cylindrical optical fiber. The electric-field profile of the LP10 fiber mode is also shown in FIG. 3 for illustration purposes. The optical fiber configured to receive light from VCSEL 200 may be directly butt-coupled to the VCSEL (also see FIG. 6) or, alternatively, optically coupled to the VCSEL using appropriate imaging optics.

In a second configuration illustrated in FIG. 3, nominally identical smaller injection currents are applied to each of electrodes $212_1$ and $212_3$ and a larger injection current is applied to electrode $212_2$. In addition, VCSEL 200 is configured to cause (i) the light of the peaks located in circles $220_1$ and $220_3$ to have the same relative phase and (ii) the light of the peak located in circle $220_2$ to be phase-shifted by about 180 degrees with respect to the light of the peaks located in circles $220_1$ and $220_3$. A person of ordinary skill in the art will understand that this particular light distribution may be suitable for exciting the LP11a mode of a cylindrical optical fiber. The electric-field profile of the LP11a fiber mode is also shown in FIG. 3 for illustration purposes.

In a third configuration illustrated in FIG. 3, nominally identical injection currents are applied to each of electrodes $212_1$ and $212_3$ and no injection current is applied to electrode $212_2$. In addition, VCSEL 200 is configured to cause the light of the peaks located in circles $220_1$ and $220_3$ to have a relative phase shift of about 180 degrees. A person of ordinary skill in the art will understand that this particular light distribution may be suitable for exciting the LP11b mode of a cylindrical optical fiber. The electric-field profile of the LP11b fiber mode is also shown in FIG. 3 for illustration purposes.

FIG. 4 shows a top view of a VCSEL 400 according to another alternative embodiment. The layer stack used in VCSEL 400 may be generally similar to the layer stack used in VCSEL 100 (see FIG. 1B). However, VCSEL 400 and VCSEL 100 (FIGS. 1A-1B) differ from one another in the number of the metal electrodes that are used for injecting electrical current into the active region of the optical resonator. Also, the lasing wavelength of VCSEL 400 and the lateral dimensions of the optical resonator of VCSEL 400 are selected such that the optical resonator can support six (or more) transverse resonator modes. Recall that the optical resonator of VCSEL 100 is designed to support three (or more) transverse resonator modes.

Different transverse resonator modes or different linear combinations of transverse resonator modes can be excited in the optical resonator of VCSEL 400 by applying different individually controlled injection currents to electrodes $412_1$-$412_6$. As shown in FIG. 4, electrodes $412_1$-$412_5$ have an arched shape and are placed at the edge of the circle that approximately marks the lateral boundary of the optical resonator of VCSEL 400. Electrode $412_6$ has a circular shape and is located closer to the central axis of the optical resonator. A person of ordinary skill in the art will understand that the shape and position of electrode $412_6$ help to provide more-selective excitation of an optical-resonator mode that is similar to the LP02 mode of a cylindrical optical fiber.

FIG. 5 shows a top view of a VCSEL 500 according to yet another alternative embodiment. The layer stack used in VCSEL 500 may be generally similar to the layer stack used in VCSEL 100 (see FIG. 1B). VCSEL 500 is similar to VCSEL 400 in that its optical resonator can support six or more transverse resonator modes. However, VCSEL 500 and VCSEL 400 differ from one another in the geometric shape of their respective optical resonators. More specifically, the transverse shape of the optical resonator of VCSEL 200 can be approximated using six overlapping circles indicated by the dashed lines in FIG. 5. Each of metal electrodes $512_1$-$512_5$ has an approximately semi-circular shape and is located at the outer periphery of the corresponding outer circle. Electrode $512_6$ has a circular shape and is located closer to the central axis, encircling the inner circle. In operation, different individual injection currents can be applied to electrodes $512_1$-$512_6$ to control the modal distribution of the light emitted from the optical resonator of VCSEL 500.

From the examples described in reference to FIGS. 1-5, a person of ordinary skill in the art will be able to make and use other embodiments having other geometric shapes of the VCSEL's optical resonator and/or other numbers and shapes of the electrodes for exciting different individual transverse resonator modes or different linear combinations of transverse resonator modes.

Figure 6:
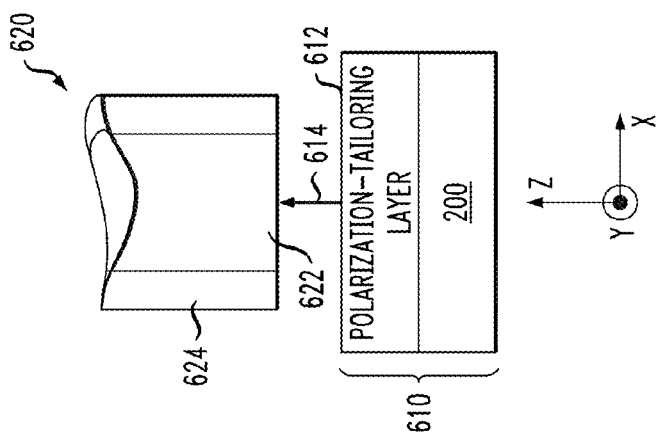
FIG. 6 shows a block diagram of a light source according to an embodiment.

FIG. 6 shows a block diagram of a light source 600 according to an embodiment. Light source 600 comprises a VCSEL 610 configured to generate a light beam 614 having a carrier wavelength, $\lambda_0$. VCSEL 610 includes VCSEL 200 (FIGS. 2A-2B) outfitted with a polarization-tailoring layer 612. In operation, polarization-tailoring layer 612 filters the output of VCSEL 200 in a manner that causes light beam 614 to be linearly polarized. Depending on the orientation of polarization-tailoring layer 612, light beam 614 can have an X-polarization or a Y-polarization. The orientation of VCSEL 610 with respect to the X- and Y-coordinate axes is indicated in FIG. 6 by the corresponding coordinate-axis triad. Example polarization-tailoring layers that can be used as polarization-tailoring layer 612 are disclosed, e.g., in the above-cited U.S. Patent Application Publication 2011/0280269.

Light source 600 further comprises an optical fiber 620 that is butt-coupled to VCSEL 610 to receive light beam 614 for guiding the received light beam to an external circuit or device (not explicitly shown in FIG. 6). Optical fiber 620 has an optical core 622 and a cladding 624. The refractive indices of optical core 622 and cladding 624 and the diameter of the optical core are such that, for wavelength $\lambda_0$, optical fiber 620 is a multimode fiber. In some embodiments, optical fiber 620 can be a few-mode fiber. VCSEL 610 can be operated to selectively excite the LP01 mode or an LP11 mode of optical fiber 620, e.g., as already explained above in reference to FIG. 3.

Figure 7:
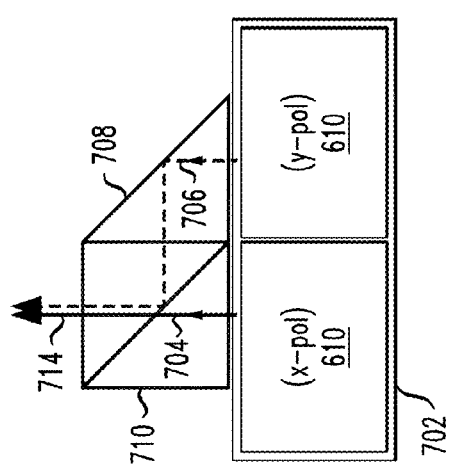
FIG. 7 shows a block diagram of a light source according to another embodiment.

FIG. 7 shows a block diagram of a light source 700 according to another embodiment. Light source 700 operates to generate a light beam 714 having two orthogonal polarization components suitable for polarization-division-multiplexing (PDM) applications. Light source 700 comprises two instances (nominal copies) of VCSEL 610 (FIG. 6), one of which is rotated with respect to the other by 90 degrees. As a result, the first instance of VCSEL 610 operates to generate an X-polarized light beam 704, while the second instance of VCSEL 610 operates to generate a Y-polarized light beam 706. A mirror 708 and a polarization combiner 710 are configured to spatially and directionally combine light beams 704 and 706, thereby generating light beam 714. In some embodiments, the two instances of VCSEL 610 used in light source 700 can be fabricated using a common semiconductor substrate 702.

Figure 8:
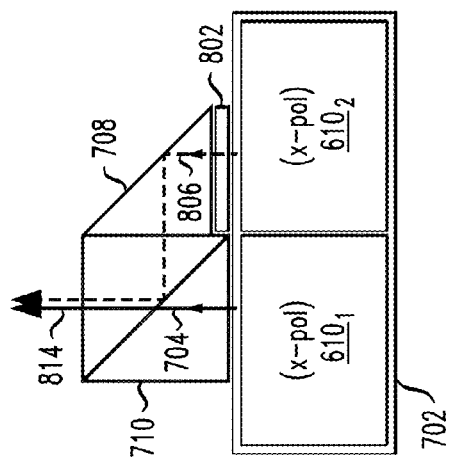
FIG. 8 shows a block diagram of a light source according to yet another embodiment.

FIG. 8 shows a block diagram of a light source 800 according to yet another embodiment. Light source 800 is functionally similar to light source 700 (FIG. 7) and operates to generate a light beam 814 having two orthogonal polarization components suitable for PDM applications. However, light source 800 differs from light source 700 in that the two instances of VCSEL 610 (labeled $610_1$ and $610_2$) have the same orientation of their polarization-tailoring layers 612, which causes each of them to output X-polarized light. A half-wavelength waveplate 802 rotates the polarization of the light beam generated by VCSEL $610_2$, thereby generating a Y-polarized light beam 806. Mirror 708 and polarization combiner 710 then generate light beam 814 by spatially and directionally combining light beams 704 and 806, as indicated in FIG. 8.

Figure 9:
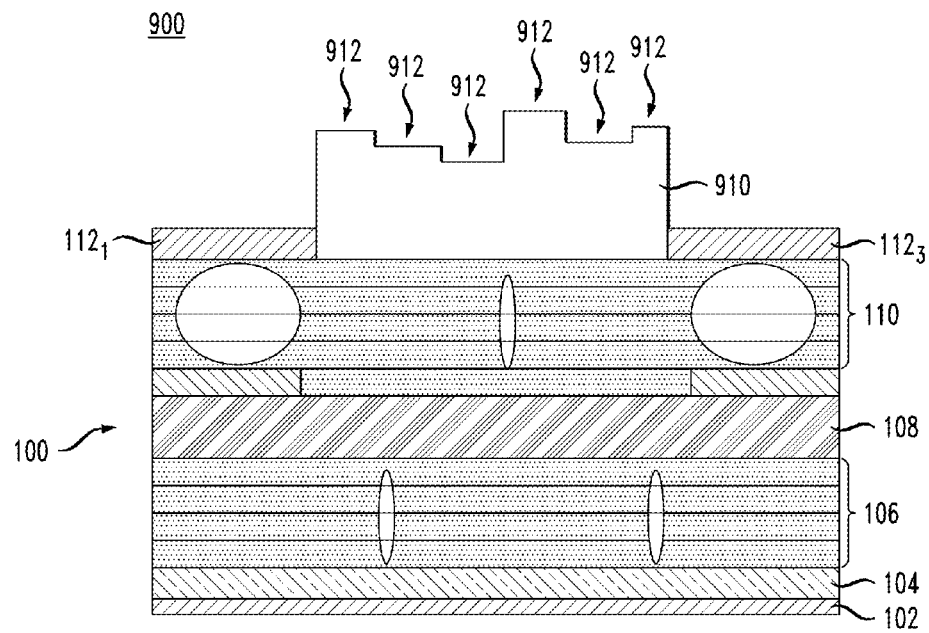
FIG. 9 shows a cross-sectional side view of a VCSEL according to yet another alternative embodiment.

FIG. 9 shows a cross-sectional side view of a VCSEL 900 according to yet another alternative embodiment. VCSEL 900 is a modification of VCSEL 100 (FIG. 1) that includes an added fixed two-dimensional phase mask 910. Phase mask 910 has a plurality of segments 912, each having a respective fixed thickness that differs from the thickness of at least one other segment 912. In operation, different segments 912 impose phase shifts corresponding to their thickness, thereby spatially phase-filtering the optical output beam generated by VCSEL 100. In various embodiments, phase mask 910 can be fabricated using, e.g., quartz, photoresist, silicon nitride, or other suitable optically transparent material.

Figure 10:
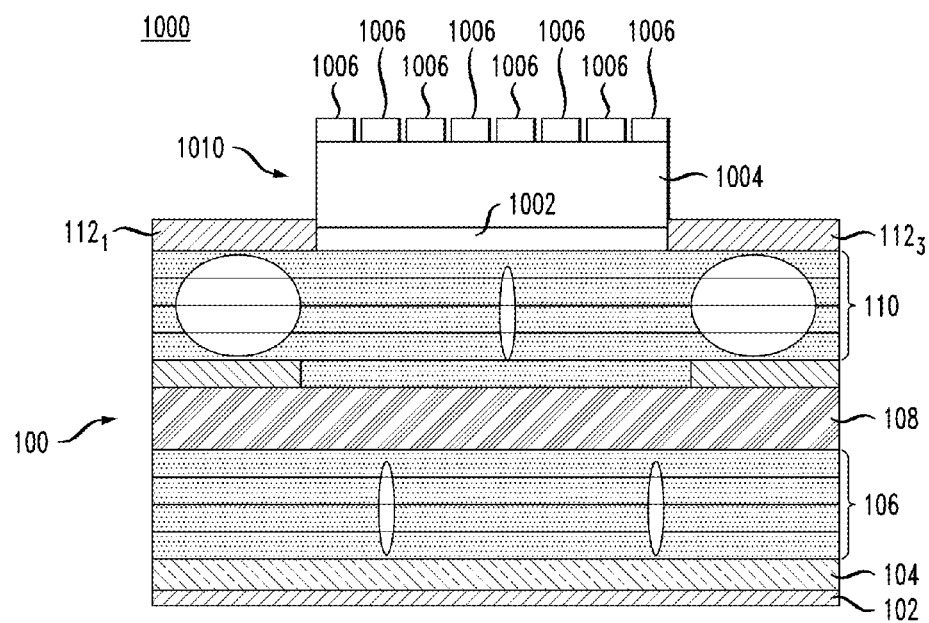
FIG. 10 shows a cross-sectional side view of a VCSEL according to yet another alternative embodiment.

FIG. 10 shows a cross-sectional side view of a VCSEL 1000 according to yet another alternative embodiment. VCSEL 1000 is a modification of VCSEL 100 (FIG. 1) that includes an added configurable two-dimensional phase mask 1010. Phase mask 1010 comprises a configurable phase-modulation layer 1004 disposed on an electrode 1002. Phase mask 1010 further comprises a plurality of electrodes 1006 disposed on phase-modulation layer 1004. Each electrode 1006 can be individually electrically biased with respect to electrode 1002. Phase-modulation layer 1004 comprises a material (e.g., a liquid crystal) whose refractive index depends on the applied electric field. In operation, different desired voltages can be applied to different electrodes 1006 to cause the respective portions of phase-modulation layer 1004 to impose phase shifts corresponding to their local refractive indices. The applied voltages can be changed as appropriate or necessary to change the two-dimensional phase profile imposed by phase mask 1010 onto the optical output beam generated by VCSEL 100. In an example embodiment, electrodes 1002 and 1006 may be fabricated using a suitable optically transparent material, such as an electrically conducting metal oxide.

According to an example embodiment disclosed above in reference to FIGS. 1-10, provided is an apparatus comprising: a substrate (e.g., 104, FIG. 1B); a first DBR mirror (e.g., 106, FIG. 1B) supported on the substrate at a first offset distance; a second DBR mirror (e.g., 110, FIG. 1B) supported on the substrate at a second offset distance that is greater than the first offset distance; an active semiconductor region (e.g., 108, FIG. 1B) located between the first DBR mirror and the second DBR mirror; and a first plurality of electrodes (e.g., $112_1$-$112_3$, FIG. 1A), each configured to inject a respective individually controllable electrical current into the active semiconductor region to cause light generation therein at a lasing wavelength (e.g., $\lambda_0$). An optical resonator bounded by the first DBR mirror and the second DBR mirror is configured to support a plurality of transverse resonator modes corresponding to the lasing wavelength (e.g., as indicated in FIG. 3).

In some embodiments of the above apparatus, the apparatus is operable to: excite a first linear combination of the transverse resonator modes (e.g., configuration 1, FIG. 3) using a first set of the respective individually controllable electrical currents applied to the first plurality of electrodes; and excite a second linear combination of the transverse resonator modes (e.g., configuration 3, FIG. 3) using a second set of the respective individually controllable electrical currents applied to the first plurality of electrodes, the second linear combination being different from the first linear combination.

In some embodiments of any of the above apparatus, the first plurality of electrodes includes at least three electrodes (e.g., $112_1$-$112_3$, FIG. 1A).

In some embodiments of any of the above apparatus, the first plurality of electrodes includes at least six electrodes (e.g., $412_1$-$412_6$, FIG. 4).

In some embodiments of any of the above apparatus, each of the first plurality of electrodes is supported on the substrate at a third offset distance different from each of the first and second offset distances.

In some embodiments of any of the above apparatus, the third offset distance is greater than the second offset distance.

In some embodiments of any of the above apparatus, the apparatus further comprises an additional electrode (e.g., 102, FIG. 1B) configured to receive the electrical currents from the first plurality of electrodes by way of the active semiconductor region.

In some embodiments of any of the above apparatus, the additional electrode is adjacent to the first DBR mirror.

In some embodiments of any of the above apparatus, each of the first plurality of electrodes is adjacent to the second DBR mirror.

In some embodiments of any of the above apparatus, the first DBR mirror comprises a first plurality of layers (e.g., $107_1$-$107_4$, FIG. 1B) including a respective first subset of layers having a first refractive index and a respective second subset of layers having a second refractive index different from the first refractive index.

In some embodiments of any of the above apparatus, the second DBR mirror comprises a second plurality of layers (e.g., $111_1$-$111_4$, FIG. 1B) including a respective first subset of layers having a third refractive index and a respective second subset of layers having a fourth refractive index different from the third refractive index.

In some embodiments of any of the above apparatus, the first DBR mirror comprises a p-type semiconductor.

In some embodiments of any of the above apparatus, the second DBR mirror comprises an n-type semiconductor.

In some embodiments of any of the above apparatus, the active semiconductor region includes one or more quantum wells configured to generate light at the lasing wavelength in response to an electrical current received by way of the first plurality of electrodes.

In some embodiments of any of the above apparatus, the first DBR mirror or the second DBR mirror, or both the first and second DBR mirrors comprise one or more ion-implanted regions (e.g., 116, FIG. 1B) located in an optical path of light emitted from the optical resonator.

In some embodiments of any of the above apparatus, the apparatus further comprises a polarization-tailoring layer (e.g., 612, FIG. 6) configured to cause a light beam (e.g., 614, FIG. 6) emitted by the apparatus to be linearly polarized.

In some embodiments of any of the above apparatus, the first DBR mirror, the second DBR mirror, the active semiconductor region, and the first plurality of electrodes are parts of a first VCSEL (e.g., $610_1$, FIG. 8); and wherein the apparatus further comprises a second VCSEL (e.g., $610_2$, FIG. 8) fabricated on the substrate (e.g., 702, FIG. 8).

In some embodiments of any of the above apparatus, the first VCSEL is configured to emit a first light beam (e.g., 704, FIG. 7) having a first linear polarization (e.g., X-polarization); and the second VCSEL is configured to emit a second light beam (e.g., 706, FIG. 7) having a second linear polarization (e.g., Y-polarization) orthogonal to the first linear polarization.

In some embodiments of any of the above apparatus, the apparatus further comprises a beam combiner (e.g., 708 and 710, FIG. 7) configured to spatially and directionally combine the first light beam and the second light beam.

In some embodiments of any of the above apparatus, the optical resonator has a transverse geometric shape approximated by three or more partially overlapping circles (e.g., $220_1$-$220_3$, FIG. 2A).

In some embodiments of any of the above apparatus, the first plurality of electrodes includes at least three electrodes (e.g., $212_1$-$212_3$, FIG. 2A; $512_1$-$512_5$, FIG. 5), each having an approximately semicircular shape (e.g., corresponding to an arch angle between 90 degrees and 270 degrees) and located at an edge of a respective one of the three or more partially overlapping circles.

In some embodiments of any of the above apparatus, the first plurality of electrodes includes: a circular electrode (e.g., $412_6$, FIG. 4; e.g., $512_6$, FIG. 5) that is approximately centered (e.g., within 25% of the electrode's diameter) on an optical axis of the optical resonator; and two or more arch-shaped electrodes (e.g., $412_1$-$412_5$, FIG. 4; e.g., $512_1$-$512_5$, FIG. 5) that laterally surround the circular electrode.

In some embodiments of any of the above apparatus, the apparatus further comprises an optical fiber (e.g., 620, FIG. 6) configured to receive a light beam (e.g., 614, FIG. 6) emitted from the optical resonator.

In some embodiments of any of the above apparatus, the apparatus further comprises a fixed or configurable phase mask (e.g., 910, FIG. 9; 1010, FIG. 10) configured to spatially filter light emitted from the optical resonator.

While this disclosure includes references to illustrative embodiments, this specification is not intended to be construed in a limiting sense.

For example, as used herein, the term "linear combination of transverse resonator modes" should be construed to cover a single transverse resonator mode of the optical resonator of a disclosed VCSEL. Under this interpretation, a single transverse resonator mode is a linear combination of transverse resonator modes having only one non-zero coefficient, with all other coefficients being zero.

Various modifications of the described embodiments, as well as other embodiments within the scope of the disclosure, which are apparent to persons skilled in the art to which the disclosure pertains are deemed to lie within the principle and scope of the disclosure, e.g., as expressed in the following claims.

Unless explicitly stated otherwise, each numerical value and range should be interpreted as being approximate as if the word "about" or "approximately" preceded the value or range.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Throughout the detailed description, the drawings, which are not to scale, are illustrative only and are used in order to explain, rather than limit the disclosure. The use of terms such as height, length, width, top, bottom, is strictly to facilitate the description of the embodiments and is not intended to limit the embodiments to a specific orientation. For example, height does not imply only a vertical rise limitation, but is used to identify one of the three dimensions of a three dimensional structure as shown in the figures.

Such "height" would be vertical where the layers and electrodes are horizontal but would be horizontal where the layers and electrodes are vertical, and so on. Similarly, while all figures show the different layers as horizontal layers such orientation is for descriptive purpose only and not to be construed as a limitation.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The described embodiments are to be considered in all respects as only illustrative and not restrictive. In particular, the scope of the disclosure is indicated by the appended claims rather than by the description and figures herein. All changes that come within the meaning and range of equivalency of the claims are to be embraced within their scope.

The description and drawings merely illustrate the principles of the disclosure. It will thus be appreciated that those of ordinary skill in the art will be able to devise various arrangements that, although not explicitly described or shown herein, embody the principles of the disclosure and are included within its spirit and scope. Furthermore, all statements herein reciting principles, aspects, and embodiments of the disclosure, as well as specific examples thereof, are intended to encompass equivalents thereof.

It should be appreciated by those of ordinary skill in the art that any block diagrams herein represent conceptual views of illustrative circuitry embodying the principles of the disclosure.

What is claimed is:

1. An apparatus comprising:
   a substrate;
   a first distributed Bragg reflector (DBR) mirror supported on the substrate at a first offset distance;
   a second DBR mirror supported on the substrate at a second offset distance that is greater than the first offset distance;
   an active semiconductor region located between the first DBR mirror and the second DBR mirror;
   a first plurality of electrodes, each configured to inject a respective individually controllable electrical current into the active semiconductor region to cause light generation therein at a lasing wavelength; and
   an additional electrode configured to receive the respective individually controllable electrical currents from the first plurality of electrodes by way of the active semiconductor region;
   wherein an optical resonator bounded by the first DBR mirror and the second DBR mirror is configured to support a plurality of transverse resonator modes corresponding to the lasing wavelength;
   wherein the first DBR mirror, the second DBR mirror, the active semiconductor region, and the first plurality of electrodes are parts of a first vertical-cavity surface-emitting laser (VCSEL);
   wherein the additional electrode is adjacent to the first DBR mirror; and
   wherein each of the first plurality of electrodes is adjacent to the second DBR mirror.

2. The apparatus of claim 1, wherein the apparatus is operable to:
   excite a first linear combination of the transverse resonator modes using a first set of the respective individually controllable electrical currents injected by the first plurality of electrodes into the active semiconductor region and received by the additional electrode; and
   excite a second linear combination of the transverse resonator modes using a second set of the respective individually controllable electrical currents injected by the first plurality of electrodes into the active semiconductor region and received by the additional electrode, the second linear combination being different from the first linear combination.

3. The apparatus of claim 1, wherein the first plurality of electrodes includes at least three electrodes.

4. The apparatus of claim 1, wherein each of the first plurality of electrodes is supported on the substrate at a third offset distance different from each of the first and second offset distances.

5. The apparatus of claim 4, wherein the third offset distance is greater than the second offset distance.

6. The apparatus of claim 1,
   wherein the first DBR mirror comprises a first plurality of layers including a respective first subset of layers having a first refractive index and a respective second subset of layers having a second refractive index different from the first refractive index; and
   wherein the second DBR mirror comprises a second plurality of layers including a respective first subset of layers having a third refractive index and a respective second subset of layers having a fourth refractive index different from the third refractive index.

7. The apparatus of claim 1,
   wherein the first DBR mirror comprises a p-type semiconductor; and
   wherein the second DBR mirror comprises an n-type semiconductor.

8. The apparatus of claim 1, wherein the active semiconductor region includes one or more quantum wells configured to generate light at the lasing wavelength in response to an electrical current received by way of the first plurality of electrodes.

9. The apparatus of claim 1, wherein the first DBR mirror or the second DBR mirror, or both the first and second DBR mirrors comprise one or more ion-implanted regions located in an optical path of light emitted from the optical resonator.

10. The apparatus of claim 1, further comprising a polarization-tailoring layer supported on the substrate at a third offset distance that is greater than the second offset distance and configured to cause a light beam emitted by the apparatus to be linearly polarized.

11. The apparatus of claim 1, wherein the apparatus further comprises a second VCSEL fabricated on the substrate.

12. The apparatus of claim 11, wherein:
   the first VCSEL is configured to emit a first light beam having a first linear polarization; and
   the second VCSEL is configured to emit a second light beam having a second linear polarization orthogonal to the first linear polarization.

13. The apparatus of claim 12, further comprising a beam combiner configured to spatially and directionally combine the first light beam and the second light beam.

14. The apparatus of claim 1, wherein the optical resonator has a transverse geometric shape approximated by three or more partially overlapping circles.

15. The apparatus of claim 14, wherein the first plurality of electrodes includes at least three electrodes, each having an approximately semicircular shape and located at an edge of a respective one of the three or more partially overlapping circles.

16. The apparatus of claim 1, wherein the first plurality of electrodes includes:
   a circular electrode that is approximately centered on an optical axis of the optical resonator; and
   two or more arch-shaped electrodes that laterally surround the circular electrode.

17. The apparatus of claim 1, further comprising an optical fiber configured to receive a light beam emitted from the optical resonator.

18. The apparatus of claim 1, further comprising a fixed or configurable phase mask supported on the substrate at a third offset distance that is greater than the second offset distance and configured to spatially filter light emitted from the optical resonator.

19. An apparatus comprising:
   a substrate;
   a first distributed Bragg reflector (DBR) mirror supported on the substrate at a first offset distance;
   a second DBR mirror supported on the substrate at a second offset distance that is greater than the first offset distance;
   an active semiconductor region located between the first DBR mirror and the second DBR mirror;
   a first plurality of electrodes, each configured to inject a respective individually controllable electrical current into the active semiconductor region to cause light generation therein at a lasing wavelength; and
   an additional electrode configured to receive the electrical currents from the first plurality of electrodes by way of the active semiconductor region;
   wherein an optical resonator bounded by the first DBR mirror and the second DBR mirror is configured to support a plurality of transverse resonator modes corresponding to the lasing wavelength;
   wherein the additional electrode is adjacent to the first DBR mirror; and
   wherein each of the first plurality of electrodes is adjacent to the second DBR mirror.

20. An apparatus comprising:
   a substrate;
   a first distributed Bragg reflector (DBR) mirror supported on the substrate at a first offset distance;
   a second DBR mirror supported on the substrate at a second offset distance that is greater than the first offset distance;
   an active semiconductor region located between the first DBR mirror and the second DBR mirror; and
   a first plurality of electrodes, each configured to inject a respective individually controllable electrical current into the active semiconductor region to cause light generation therein at a lasing wavelength;
   wherein an optical resonator bounded by the first DBR mirror and the second DBR mirror is configured to support a plurality of transverse resonator modes corresponding to the lasing wavelength;
   wherein the first DBR mirror, the second DBR mirror, the active semiconductor region, and the first plurality of electrodes are parts of a first vertical-cavity surface-emitting laser (VCSEL);
   wherein the apparatus further comprises a second VCSEL fabricated on the substrate; and
   wherein the first VCSEL is configured to emit a first light beam having a first linear polarization; and the second VCSEL is configured to emit a second light beam having a second linear polarization orthogonal to the first linear polarization.

21. The apparatus of claim 20, further comprising a beam combiner configured to spatially and directionally combine the first light beam and the second light beam.

22. An apparatus comprising:
   a substrate;
   a first distributed Bragg reflector (DBR) mirror supported on the substrate at a first offset distance;
   a second DBR mirror supported on the substrate at a second offset distance that is greater than the first offset distance;
   an active semiconductor region located between the first DBR mirror and the second DBR mirror; and
   a first plurality of electrodes, each configured to inject a respective individually controllable electrical current into the active semiconductor region to cause light generation therein at a lasing wavelength;
   wherein an optical resonator bounded by the first DBR mirror and the second DBR mirror is configured to support a plurality of transverse resonator modes corresponding to the lasing wavelength; and
   wherein the optical resonator has a transverse geometric shape approximated by three or more partially overlapping circles.

23. The apparatus of claim 22, wherein the first plurality of electrodes includes at least three electrodes, each having an approximately semicircular shape and located at an edge of a respective one of the three or more partially overlapping circles.

24. An apparatus comprising:
   a substrate;
   a first distributed Bragg reflector (DBR) mirror supported on the substrate at a first offset distance;
   a second DBR mirror supported on the substrate at a second offset distance that is greater than the first offset distance;
   an active semiconductor region located between the first DBR mirror and the second DBR mirror; and
   a first plurality of electrodes, each configured to inject a respective individually controllable electrical current into the active semiconductor region to cause light generation therein at a lasing wavelength;
   wherein an optical resonator bounded by the first DBR mirror and the second DBR mirror is configured to support a plurality of transverse resonator modes corresponding to the lasing wavelength; and
   wherein the first plurality of electrodes includes:
      a circular electrode that is approximately centered on an optical axis of the optical resonator; and
      two or more arch-shaped electrodes that laterally surround the circular electrode.

25. An apparatus comprising:
   a substrate;
   a first distributed Bragg reflector (DBR) mirror supported on the substrate at a first offset distance;
   a second DBR mirror supported on the substrate at a second offset distance that is greater than the first offset distance;
   an active semiconductor region located between the first DBR mirror and the second DBR mirror;
   a first plurality of electrodes, each configured to inject a respective individually controllable electrical current into the active semiconductor region to cause light generation therein at a lasing wavelength; and an additional electrode configured to receive the respective individually controllable electrical currents from the first plurality of electrodes by way of the active semiconductor region;

wherein an optical resonator bounded by the first DBR mirror and the second DBR mirror is configured to support a plurality of transverse resonator modes corresponding to the lasing wavelength;

wherein the first DBR mirror, the second DBR mirror, the active semiconductor region, and the first plurality of electrodes are parts of a first vertical-cavity surface-emitting laser (VCSEL); and wherein the apparatus further comprises a fixed or configurable phase mask supported on the substrate at a third offset distance that is greater than the second offset distance and configured to spatially filter light emitted from the optical resonator.

\* \* \* \* \*